(12) United States Patent
Sinclair et al.

(10) Patent No.: US 9,685,765 B2
(45) Date of Patent: Jun. 20, 2017

(54) HIGH QUALITY-FACTOR FANO METASURFACE COMPRISING A SINGLE RESONATOR UNIT CELL

(71) Applicant: Sandia Corporation, Albuquerque, NM (US)

(72) Inventors: Michael B. Sinclair, Albuquerque, NM (US); Larry K. Warne, Albuquerque, NM (US); Lorena I. Basilio, Albuquerque, NM (US); William L. Langston, Albuquerque, NM (US); Salvatore Campione, Albuquerque, NM (US); Igal Brener, Albuquerque, NM (US); Sheng Liu, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 15/227,440

(22) Filed: Aug. 3, 2016

(65) Prior Publication Data
US 2017/0063039 A1    Mar. 2, 2017

Related U.S. Application Data

(60) Provisional application No. 62/212,258, filed on Aug. 31, 2015.

(51) Int. Cl.
*H01S 5/12* (2006.01)
*G02B 1/00* (2006.01)
*H01S 5/10* (2006.01)

(52) U.S. Cl.
CPC ............... *H01S 5/12* (2013.01); *G02B 1/002* (2013.01); *H01S 5/1042* (2013.01)

(58) Field of Classification Search
CPC ........ H01S 5/12; H01S 5/1042; H01S 5/3013; H01S 5/3022
See application file for complete search history.

(56) References Cited

U.S. PATENT DOCUMENTS

| 8,703,391 | B1 * | 4/2014 | Dirk .................... G03F 7/038 |
| | | | 430/311 |
| 9,374,887 | B1 | 6/2016 | Warne et al. |
| 2012/0154793 | A1 * | 6/2012 | Pryce ................ G01N 21/3581 |
| | | | 356/51 |

(Continued)

OTHER PUBLICATIONS

Campione, S. et al., "Tailoring Dielectric Resonator Geometries for Directional Scattering and Huygens' Metasurfaces", Optical Express, 2015, pp. 2293-2307, vol. 23.

(Continued)

*Primary Examiner* — Eric Bolda
(74) *Attorney, Agent, or Firm* — Kevin W. Bieg (57) ABSTRACT

A new monolithic resonator metasurface design achieves ultra-high Q-factors while using only one resonator per unit cell. The metasurface relies on breaking the symmetry of otherwise highly symmetric resonators to induce intra-resonator mixing of bright and dark modes (rather than inter-resonator couplings), and is scalable from the near-infrared to radio frequencies and can be easily implemented in dielectric materials. The resulting high-quality-factor Fano metasurface can be used in many sensing, spectral filtering, and modulation applications.

16 Claims, 9 Drawing Sheets

(56) References Cited

U.S. PATENT DOCUMENTS

2013/0160936 A1* 6/2013 Cheah ..................... B32B 27/36
156/230
2015/0322589 A1* 11/2015 Busnaina ............... C25D 13/02
204/477

OTHER PUBLICATIONS

Choquette, K. D. et al., "Fabrication and Performance of Selectively Oxidized Vertical-Cavity Lasers", IEEE Photonics Technology Letters, 1995, pp. 1237-1239, vol. 7.

Choquette, K. D. et al., "Advances in Selective Wet Oxidation of AlGaAs Alloys", IEEE Journal of Selected Topics in Quantum Electronics, 1997, pp. 916-926, vol. 3.

Ginn, J. C. et al., "Realizing Optical Magnetism from Dielectric Metamaterials", Physical Review Letters, 2012, pp. 097402-1-097402-5, vol. 108.

Singh, R. et al., "Ultrasensitive Terahertz Sensing with High-Q Fano Resonances in Metasurfaces", Applied Physics Letters, 2014, pp. 171101-1-171101-5, vol. 105.

Wang, F. et al., "Switchable and Non-Switchable Zero Backscattering of Dielectric Nano-Resonators", Optical Materials Express, 2015, pp. 668-675, vol. 5.

Warne, L. K. et al., "Perturbation Theory in the Design of Degenerate Spherical Dielectric Resonators", IEEE Transactions on Antennas and Propagation, pp. 2130-2141, vol. 61.

Warne, L. K. et al., "Perturbation Theory in the Design of Degenerate Rectangular Dielectric Resonators", Progress in Electromagnetics Research B, 2012, pp. 1-29, vol. 44.

Wu, C. et al., "Spectrally Selective Chiral Silicon Metasurfaces Based on Infrared Fano Resonances", Nature Communications, 2014, pp. 1-9.

Wu, C. et al., "Fano-resonant Asymmetric Metamaterials for Ultrasensitive Spectroscopy and Identification of Molecular Monolayers", Nature Materials, 2012, pp. 69-75. vol. 11.

Yang, Y. et al., "Electrochemical Dynamics of Nanoscale Metallic Inclusions in Dielectrics", Nature Communications, 2014, pp. 1-9.

Zhao, W. et al., "Fano Resonance in All-Dielectric Binary Nanodisk Array Realizing Optical Filter with Efficient Linewidth Tuning", Optics Express, 2015, pp. 6858-6866, vol. 23.

* cited by examiner

HIGH QUALITY-FACTOR FANO METASURFACE COMPRISING A SINGLE RESONATOR UNIT CELL

CROSS-REFERENCE TO RELATED APPLICATION

This application claims the benefit of U.S. Provisional Application No. 62/212,258, filed Aug. 31, 2015, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to metamaterials and, in particular, to a high quality-factor Fano metasurface comprising a single resonator unit cell.

BACKGROUND OF THE INVENTION

Metasurfaces are the two-dimensional surface counterparts of the fully three-dimensional bulk metamaterials. Metasurfaces are currently the subject of intensive research worldwide since they can be tailored to produce a wide range of optical behaviors. However, metasurfaces generally exhibit broad spectral resonances, and it is difficult to obtain narrow (i.e. high quality-factor, Q) spectral features. Attaining such high-Q features from metasurfaces would greatly expand their application space, particularly in the areas of sensing, spectral filtering, and optical modulation. Early metasurfaces were fabricated from metals and exhibited particularly broad resonances at infrared and optical frequencies as a result of Ohmic losses. Dielectric resonator-based metasurfaces were introduced to overcome these losses and have enabled, among others, wave-front manipulation and cloaking devices, perfect reflectors, and ultrathin lenses but, although absorptive losses were reduced, the metasurface resonances remained broad due to strong coupling with the external field (i.e. large radiation losses). See J. C. Ginn et al., *Physical Review Letters* 108(9), 097402 (2012); I. Staude et al., *ACS Nano* 7(9), 7824 (2013); A. Arbabi et al., *Nat Nano* 10(11), 937 (2015); S. Jahani and Z. Jacob, *Nat Nano* 11(1), 23 (2016); M. I. Shalaev et al., *Nano Letters* 15(9), 6261 (2015); K. E. Chong et al., *Nano Letters* 15(8), 5369 (2015); D. Lin et al., *Science* 345(6194), 298 (2014); L. Y. Hsu et al., *Progress In Electromagnetics Research* 152, 33 (2015); P. R. West et al., *Optics Express* 22(21), 26212 (2014); and P. Moitra et al., *ACS Photonics* 2(6), 692 (2015).

Recently, new strategies based on "electromagnetically induced transparency" or "Fano resonances" have been developed that show great promise for achieving high-Q resonances. See C. Wu et al., *Nat Mater* 11(1), 69 (2012); R. Singh et al., *Applied Physics Letters* 105(17), 171101 (2014); C. Wu et al., *Nat Commun* 5, (2014); Y. Yang et al., *Nat Commun* 5, (2014); and W. Zhao et al., *Optics Express* 23(5), 6858 (2015). In this approach, the resonator system is designed to support both "bright" and "dark" resonances. The incident optical field readily couples to the bright resonance, but cannot couple directly to the dark resonance. Through proper design, a weak coupling between the two resonances can be introduced, allowing energy from the incident wave to be indirectly coupled to the dark resonance. The metasurface transmission and reflection spectra resulting from such an approach feature Fano resonances that can be much narrower than the traditional metasurface resonances. This approach has been demonstrated for metal-based metasurfaces at THz frequencies where Q-factors approaching 100 have been observed. See C. Wu et al., *Nat Mater* 11(1), 69 (2012); and R. Singh et al., *Applied Physics Letters* 105(17), 171101 (2014).

Even more dramatic results have been achieved by applying this strategy to dielectric resonator-based metasurfaces and Q-factors approaching 500 have been demonstrated. See Y. Yang et al., *Nat Commun* 5, (2014). A common feature of the dielectric resonator-based Fano designs demonstrated thus far is the reliance on multiple, distinct, near-field coupled dielectric structures within the unit cell. See Y. Yang et al., *Nat Commun* 5, (2014); W. Zhao et al., *Optics Express* 23(5), 6858 (2015); and F. Wang et al., *Optical Materials Express* 5(3), 668 (2015). However, reliable and repeatable control of near-field coupling requires exacting fabrication tolerances.

Therefore, a need remains for a simpler high-Q Fano resonance metasurface design.

SUMMARY OF THE INVENTION

The present invention is directed to a new, monolithic dielectric resonator metasurface that yields high quality-factor Fano resonances. The invention utilizes perturbations of high-symmetry resonator structures, such as cubes, to induce couplings between the otherwise orthogonal resonator modes. In particular, the perturbations couple "bright" dipole modes to "dark" dipole modes whose emission is suppressed by local field effects. Specifically, the Fano metasurface of the present invention comprises a periodic two-dimensional array of single-resonator unit cells on a dielectric substrate, each resonator comprising at least one perturbation in a symmetric dielectric structure wherein the at least one perturbation has a different permittivity than the dielectric structure material, wherein the resonator has an electric or magnetic dipole moment in the plane of the substrate that couples to normally incident light and at least one out-of-plane electric or magnetic dipole moment that couples in the near-field to the in-plane electric or magnetic dipole moment, whereby the out-of-plane electric or magnetic dipole moment provides a narrow spectral resonance within a broad spectral resonance provided by the in-plane electric or magnetic dipole moment. Breaking the symmetry of otherwise symmetric resonators leads to a new Fano metasurface design that features only one resonator in the unit cell and produces very high Q-factor resonances in the metasurface transmission and reflection spectra. The invention is widely scalable from the near-infrared to radio frequencies. For example, the dielectric structure can comprise germanium, tellurium, silicon, gallium arsenide, gallium nitride, or lead telluride. For example, the perturbation can comprise a notch or a tilted or stepped sidewall of a cubic dielectric structure.

As an example of the invention, simulations of a germanium-based perturbed resonator metasurface achieved a quality factor of ~1300 at ~10.8 µm. The wavelength scalability of the invention was demonstrated using two experimental metasurfaces with extremely sharp transmission resonances in the near-infrared (~1 µm). The first utilizes silicon resonators fabricated on a silicon-on-insulator (SOI) substrate and achieves a Q-factor of about 350. The second experimental metasurface utilizes gallium arsenide resonators and achieves a Q-factor of about 600. Importantly, extending this approach to an active and nonlinear material such as GaAs leads to new device opportunities in areas such as lasers, photodetectors, modulators, nonlinear frequency converters, and sensors.

BRIEF DESCRIPTION OF THE DRAWINGS

The detailed description will refer to the following drawings, wherein like elements are referred to by like numbers.

FIGS. 1(a) and 1(b) are schematic illustrations depicting the operating principles of the Fano metasurfaces. FIG. 1(a) shows that the electric field of the incident radiation excites only the $p_x$ electric dipole mode of the cube resonators (dark arrows). The decay of the electric dipole mode is governed by both radiative (r) and non-radiative (nr) processes.

DETAILED DESCRIPTION OF THE INVENTION

Dielectric resonators are generally fabricated from high permittivity materials, such as Te, Ge, GaAs, Si, or PbTe, so that the dimensions of the resonator are smaller than the free-space wavelength at the resonator's resonant frequencies. Dielectric resonators are generally fabricated using symmetric geometries such as cubes or spheres. However, a symmetric geometry is not required provided the resonator supports an in-plane dipole mode (electric or magnetic) that can couple to incoming and outgoing plane waves. The resonant modes of symmetric resonators are orthogonal and do not couple to each other. However, certain classes of perturbations to the resonator geometry can induce coupling between the otherwise orthogonal modes. For example, one of a cubic resonator's side walls can be tilted (either in-plane or out-of-plane), or a notch can be cut near one edge of the resonator. Other geometric perturbations are possible. In addition, the perturbation can utilize other dielectric materials that are distinct from the material from which the resonator is fabricated. For example, the "notch" cut from the edge of the resonator can be filled with a different material with a larger or smaller permittivity. When perturbed in this manner, the in-plane and out-of-plane modes largely retain their character (i.e. the z-directed magnetic dipole of the symmetric resonator still has the character of a z-directed magnetic dipole in the perturbed resonator).

Dielectric resonator metasurfaces are two-dimensional, periodic arrays of dielectric resonators. The metasurfaces are non-diffractive when the period of the array is smaller than the free-space wavelength. In this case the arrays can be optically characterized by their transmission and reflection spectra. For symmetric resonators, the metasurfaces will exhibit broad spectral regions of high reflectivity at the electric and magnetic dipole resonances. However, metasurfaces of properly perturbed resonators will feature extremely sharp spectral transmission resonances in addition to the broad reflection peaks.

The present invention is directed to a new metasurface design that relies on a single resonator per unit cell and produces robust, high quality-factor Fano resonances. The metasurface utilizes symmetry breaking of highly symmetric resonator geometries, such as a cube, sphere, prism, pyramid, or cylinder, to induce couplings between the otherwise orthogonal resonator modes. In particular, the perturbations couple "bright" dipole modes to "dark" dipole modes whose radiative decay is suppressed by local field effects in the array. The design is widely scalable from the near-infrared to radio frequencies (e.g., 0.75 μm to 1 μm wavelength). The resonator can comprise a high permittivity or high refractive index material (the permittivity, $\in$, and refractive index, n, are related by $\in=n^2$ in non-magnetic materials), such as Te, Ge, Si, or a IV-VI compound comprising lead, such as PbTe. Alternatively, the resonator can comprise a III-V compound having a high refractive index, such as GaAs, GaN, or other III-V alloys. An array of such resonators can be fabricated on a low-loss substrate having a lower refractive index than the resonator material. For example, both silicon dioxide and barium fluoride have a refractive index of about 1.45 in the near-infrared. When these materials are used as a substrate, the refractive index of the resonator should be greater than about 2.5. For example, the resonator can comprise Si or GaAs which have refractive indices of about 3.5 in the near-infrared. If a high index substrate is used, the substrate can further comprise an intermediate layer having a low refractive index that can be used to separate the high index dielectric resonator from the high index substrate so that the mode is still confined within the resonator.

As described below, Fano resonance behavior is demonstrated through numerical simulations of a germanium resonator-based metasurface that achieves a quality-factor of ~1300 at ~10.8 µm. As examples of the invention, two metasurfaces were fabricated that operate in the near-infrared (~1 µm): a silicon-based metasurface that achieves a quality-factor of ~350; and a gallium arsenide-based metasurface that achieves a quality-factor of ~600. In both examples, large electromagnetic field enhancements appear within the resonators at the Fano resonant frequencies. Combining high quality-factor, high field enhancement resonances with nonlinear and active/gain materials, such as gallium arsenide, can provide new classes of active optical devices.

Figure 1A:
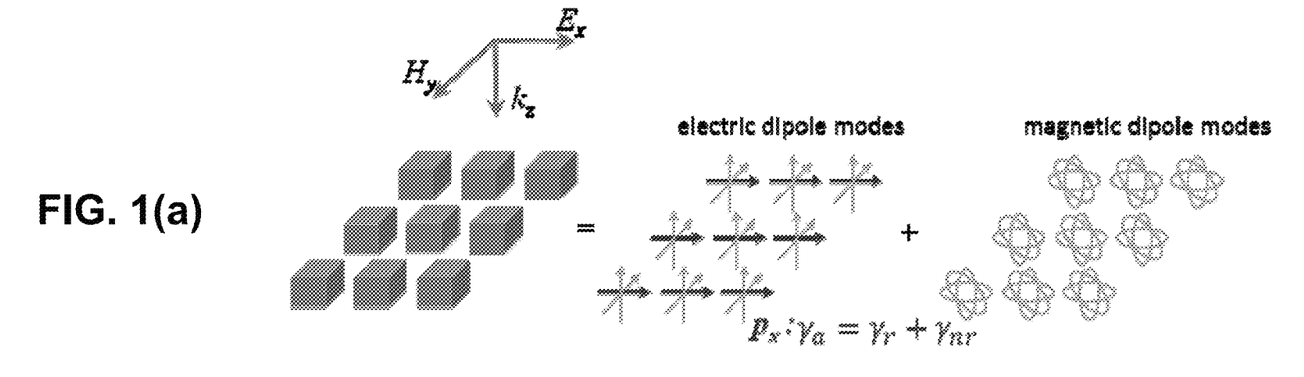
Figure 1B:
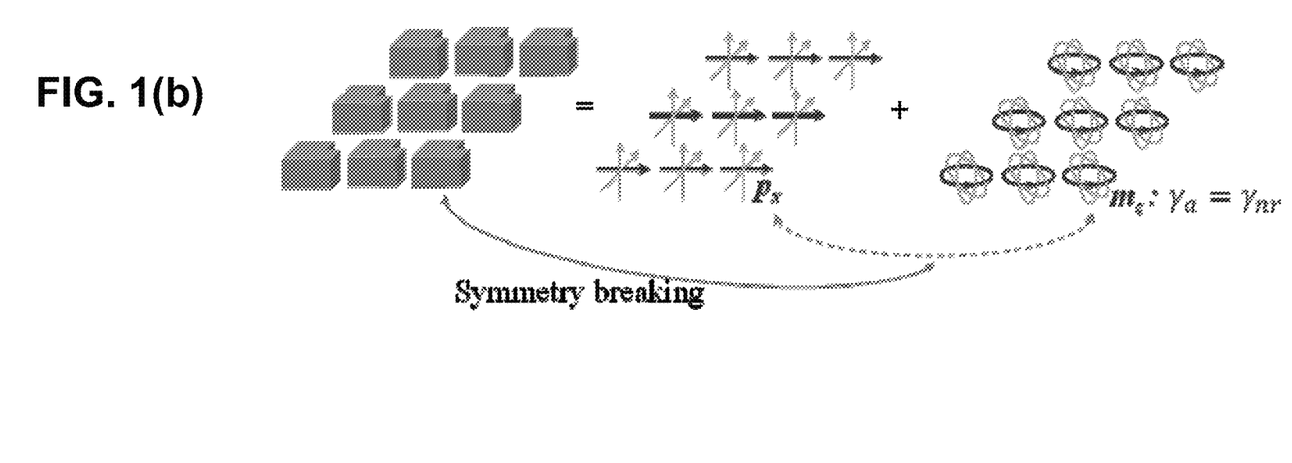
FIG. 1(b) shows how symmetry breaking can be used to allow coupling of the $p_x$ dipole to the longitudinal $m_z$ magnetic dipole (dark loops) which only decays due to non-radiative losses. A similar process (not shown) involving the bright in-plane magnetic dipole ($m_y$) and dark longitudinal electric dipole ($p_z$) leads to a second Fano resonance at higher energy.

The principles underlying the high-Q Fano metasurface are shown schematically in FIGS. 1(a) and 1(b). An exemplary resonator design starts with a simple cubic resonator similar to the dielectric resonators demonstrated in J. C. Ginn et al. See J. C. Ginn et al., *Physical Review Letters* 108(9), 097402 (2012). For an isolated resonator, such a high-symmetry geometry leads to orthogonal, but degenerate, sets of electric and magnetic dipole modes oriented along the x-, y-, and z-directions (along with other higher order multipoles). When arranged in an array with subwavelength periodicity, only the transverse (i.e. in-plane) dipole modes can couple to a normally incident electromagnetic wave, as shown in FIG. 1(a), and this results in the usual (broad) electric and magnetic transmission/reflection resonances. See J. C. Ginn et al., *Physical Review Letters* 108(9), 097402 (2012), which is incorporated herein by reference. However, it is possible to "perturb" the geometry to change the spectral positions of the modes, or even to induce mode mixing between the transverse and longitudinal dipole modes. See L. K. Warne et al., *Progress In Electromagnetics Research B* 44, 1 (2012); L. K. Warne et al., *IEEE Trans. Antennas Propagat.* 61(4), 2130 (2013); S. Campione et al., *Optics Express* 23(3), 2293 (2015); and U.S. application Ser. No. 13/618,997, each of which is incorporated herein by reference. FIG. 1(b) shows a symmetry breaking induced coupling between the $p_x$ electric dipole mode and the longitudinal $m_z$ magnetic dipole mode. While the $p_x$ dipole is subject to both radiative and non-radiative decay processes, the $m_z$ mode is subject to only non-radiative decay and high Q-values can be achieved using low-loss dielectric materials. The interference between these two modes leads to the observed high-Q Fano resonances. A similar process (not shown) involving the bright in-plane magnetic dipole ($m_y$) and dark longitudinal electric dipole ($p_z$) leads to a second Fano resonance at higher energy.

Figure 2:
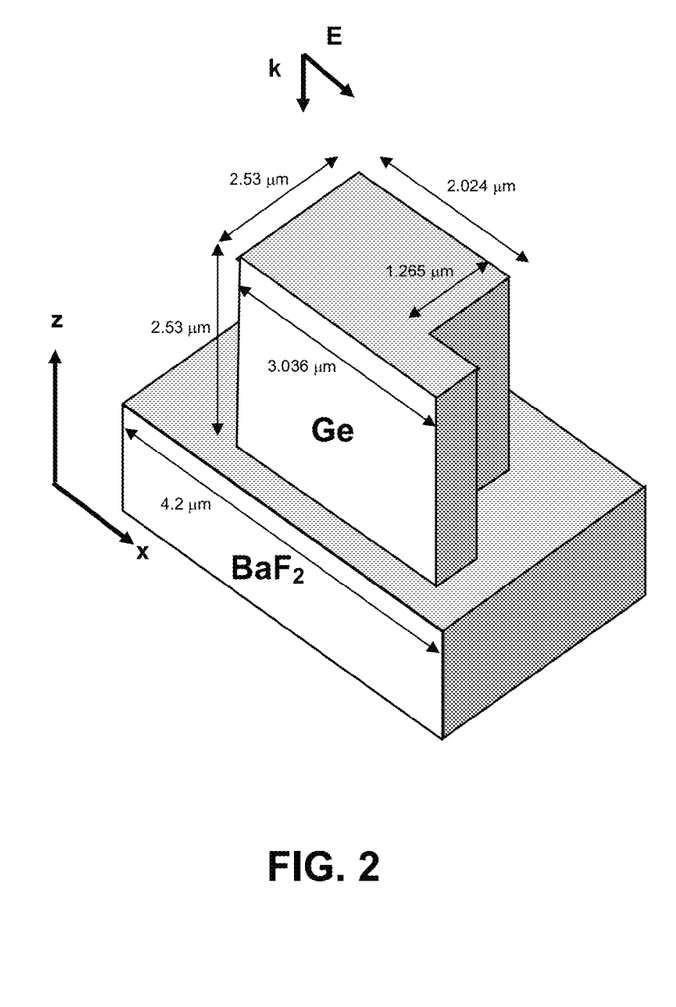
FIG. 2 is a perspective view schematic illustration of the unit cell of a germanium Fano metasurface design. The period of the metasurface is 4.2 μm.

FIG. 2 shows a schematic illustration of such a broken symmetry resonator design that utilizes germanium as the resonator material. Starting with a cubic geometry of nominal side length 2.53 µm, a small notch is cut from one corner of the cube and the adjacent corner has been slightly extended. The resonators are arrayed on a barium fluoride (BaF$_2$) substrate with an array period of 4.2 µm. Such a low index substrate is necessary to retain the original Mie modes of the dielectric resonators. See J. C. Ginn et al., *Physical Review Letters* 108(9), 097402 (2012).

Figure 3:
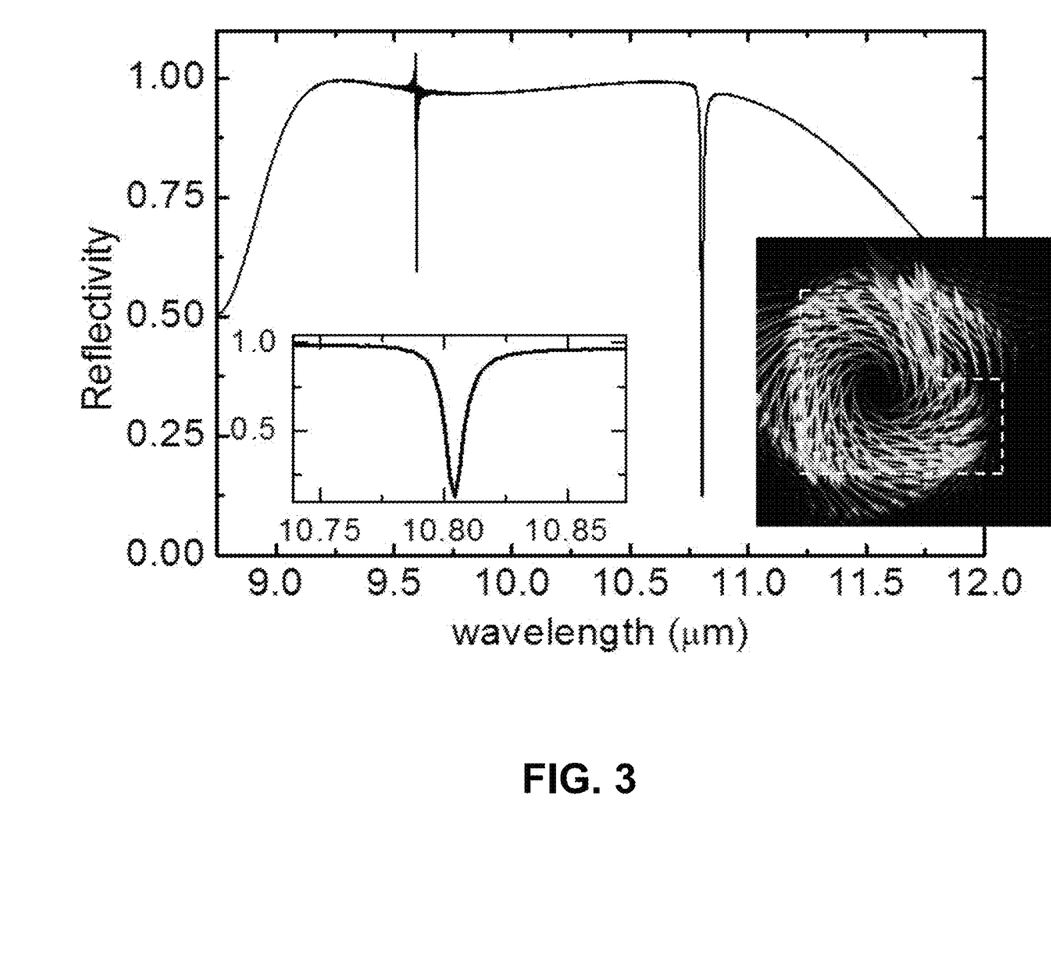
FIG. 3 is the reflectivity spectrum of the array in FIG. 2 obtained using full-wave simulations. The inset on the left shows an expanded view of the resonance at ~10.8 μm. The Q-factor for this resonance is ~1300. The inset on the right shows a vector plot of the electric field in the x-y resonator mid-plane featuring a circulating pattern.
Figure 4:
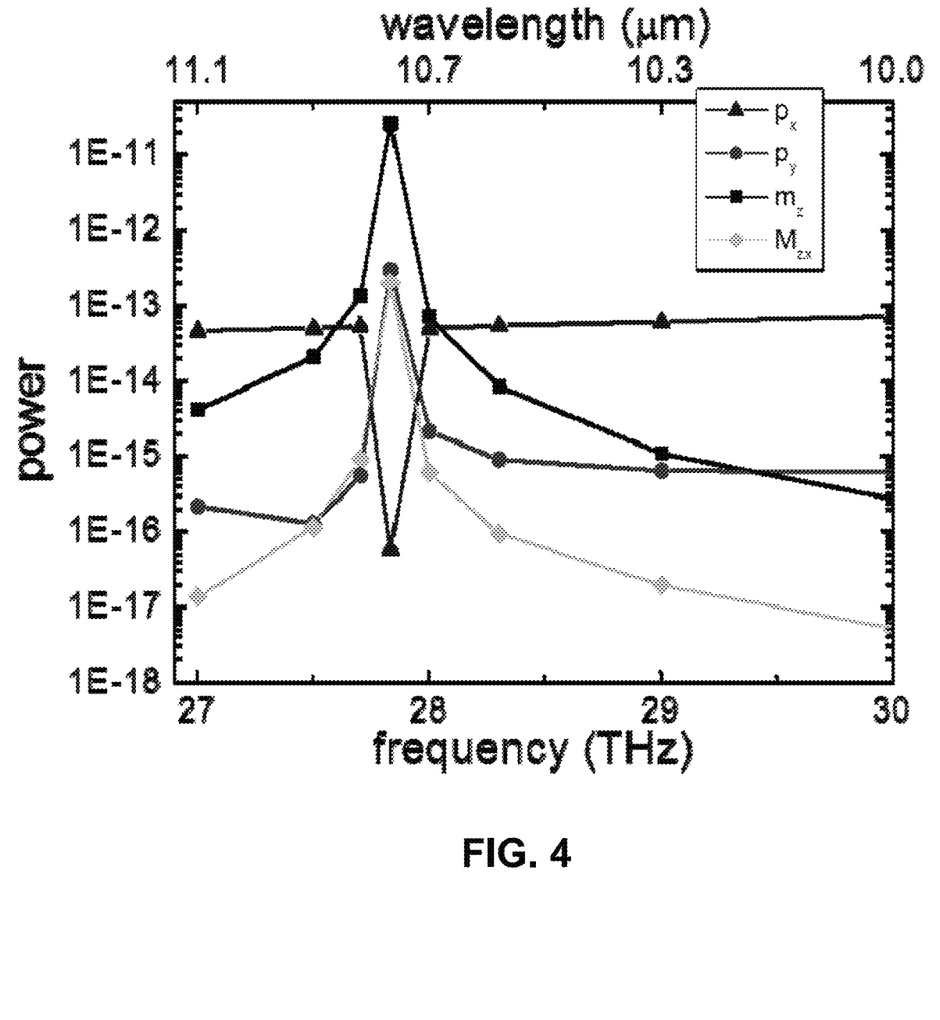
FIG. 4 is a graph of the power radiated by the four dominant multipoles of the Fano resonators when excited in the array (no substrate). At the resonant frequency the x-directed electric dipole is largely extinguished and the z-directed magnetic dipole dominates.

FIG. 3 shows the reflectivity spectrum of the germanium resonator array under x-polarized incidence obtained from a Finite Difference Time Domain (FDTD) simulation. Several extremely narrow Fano resonances are observed—the transmission spectrum (not shown) exhibits complementary (pass-band) transmission resonances. Note that the Ge properties used in the simulations included the appropriate material absorptive loss values. The quality-factor of the Fano reflection resonance (as defined by $\lambda_0/\Delta\lambda$ where $\lambda_0$ is the resonant frequency and $\Delta\lambda$ is the full width at half minimum (FWHM) of the resonance) at ~10.8 µm exceeds 1300. Furthermore, at the Fano resonant frequency, the electric and magnetic fields within the resonator are enhanced by several orders of magnitude relative to the incident field (not shown here). The inset of FIG. 3 shows a vector plot of the electric field in the x-y plane located half way through the resonator and calculated at the Fano resonance at 10.8 µm. The circulating electric field seen in the inset is reminiscent of a magnetic dipole field pattern; however, rather than the usual in-plane magnetic dipole, the orientation of the resonant dipole is out of the plane of the array (i.e. a z-directed magnetic dipole). To further confirm this assignment, the following "numerical experiment" was performed. First, the on-resonance response of the array was simulated (without a substrate for simplicity), placing a fictitious box around the center resonator of the array. Using Love's Equivalence Principle, the sources within the box (i.e. the central resonator) were replaced with equivalent electric and magnetic surface currents derived from the total tangential fields on the box. All the other resonators in the array were removed and the fields radiated by the surface currents on the box were calculated. The radiated far-fields were then decomposed into their multipole components including all the quadrupole contributions. See S. Campione et al., *Optics Express* 23(3), 2293 (2015). FIG. 4 shows the power radiated by the dominant four multipoles (the powers of the multipole components not shown in the figure are several orders of magnitude smaller than the dominant multipoles). Above and below the resonant frequency of ~27.8 THz (~10.8 µm), the x-directed electric dipole ($p_x$) dominates, as expected. However, in the vicinity of the Fano resonance the strength of $p_x$ decreases dramatically. Simultaneously, the strength of the z-directed magnetic dipole ($m_z$) increases remarkably and dominates all other multipoles by nearly two orders of magnitude. This excitation occurs indirectly, through coupling to the x-directed electric dipole. This confirms the earlier assignment of the resonant mode as $m_z$. Note also that at the resonant frequency the y-directed electric dipole ($p_y$) and the z-x magnetic quadrupole ($M_{zx}$) are also excited. However, the fields radiated by $p_y$ and $M_{zx}$ largely cancel each other in the forward and backward directions, which, in combination with the dramatic decrease of $p_x$, explains the high transmission and low reflection observed at the Fano resonance. The lack of perfect cancellation between $p_y$ and $M_{zx}$ results in a small depolarization of the transmitted wave. The reflection spectrum shown in FIG. 3 exhibits an additional Fano resonance at shorter wavelengths. A similar analysis shows that the origin of the higher energy Fano resonance appearing at ~9.7 µm in this figure is analogous to the mechanism described above. However, in this case the bright mode is an in-plane magnetic dipole ($m_y$) and the dark mode is a longitudinal electric dipole ($p_z$).

The excitation of the $m_z$ multipole likely arises due to the different widths (in the x-direction) of the two parts of the resonator. Considering each part of the resonator as a separate polarizable dielectric region, it can be seen that such an approximate spatial decomposition indicates the two separated electric dipoles will exhibit slightly different dipole strengths. Upon excitation with an x-polarized wave, the asymmetry of the two dipoles will lead to a z-directed magnetic field in the vicinity of the center of the resonator which can couple to and excite the $m_z$ dipole. Such an excitation mechanism is unavailable for the symmetric full cube resonator.

Figure 5:
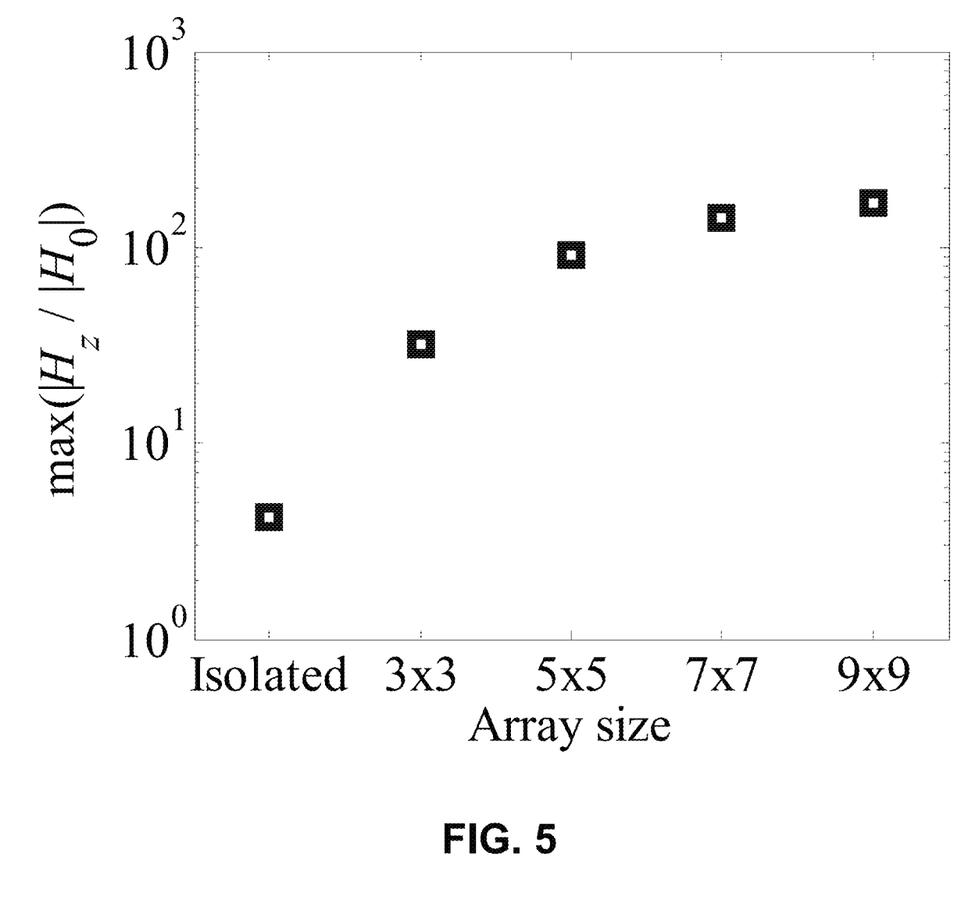
FIG. 5 is a graph of the absolute magnitude of the magnetic field enhancement for the centermost resonator as a function of array size. The enhancement rises sharply with array size for the smaller arrays, and is beginning to saturate at the largest (9×9) array. The overall size of the array required to achieve a robust Fano resonance is quite small.

The large Q-factors of the Fano resonances arise due to the small radiative and non-radiative decay rates of the z-directed magnetic dipole in the array. For an isolated resonator, the z-directed dipole is free to radiate and is also subject to non-radiative decay processes arising from material absorption. This results in broad resonance linewidths for the isolated resonator. In contrast, when placed in the two-dimensional array, the resonator's normal radiative decay is compensated by driving terms arising from the local field at the position of the resonator, leaving only the (small) non-radiative processes. See S. Tretyakov, *Analytical Modeling in Applied Electromagnetics*, London, UK: Artech House (2003); and J. E. Sipe and J. V. Kranendonk, *Physical Review A* 9(5), 1806 (1974). Thus, the overall Q-factor of the resonators, and hence the Q-factor of the Fano resonance, becomes large. To demonstrate the importance of array effects in establishing the Fano resonance, the response of finite sized arrays (no substrate for simplicity) of varying sizes was simulated. For the isolated resonator, no Fano resonance is observed and the electric field vector plots are reminiscent of a $p_x$ excitation. For the other simulations, the frequency of the Fano resonance shifts slightly as the array size increases. The 3×3 array shows a very weak Fano resonance, and the on-resonance electric field vector plots are complicated but begin to show field circulation within each resonator. The 5×5 array exhibits a clear Fano resonance, and the vector field plots for the interior resonators clearly show the electric field circulation associated with the $m_z$ dipole. Interestingly, the innermost resonator of the array shows the largest field enhancement, while the resonators at the edge of the array (which experience a drastically different local field and can radiate substantially more) show smaller field enhancements and less well defined modes. Proceeding to the 7×7 and 9×9 arrays, the number of interior resonators experiencing large field enhancements increases with array size, and once again the outermost resonators show weaker excitations. The absolute magnitude of the field enhancement for the centermost resonator rises sharply with array size for the smaller arrays, and is beginning to saturate at the largest (9×9) array, as shown in FIG. 5. Thus, the overall size of the array required to achieve a robust Fano resonance is quite small.

Figure 6:
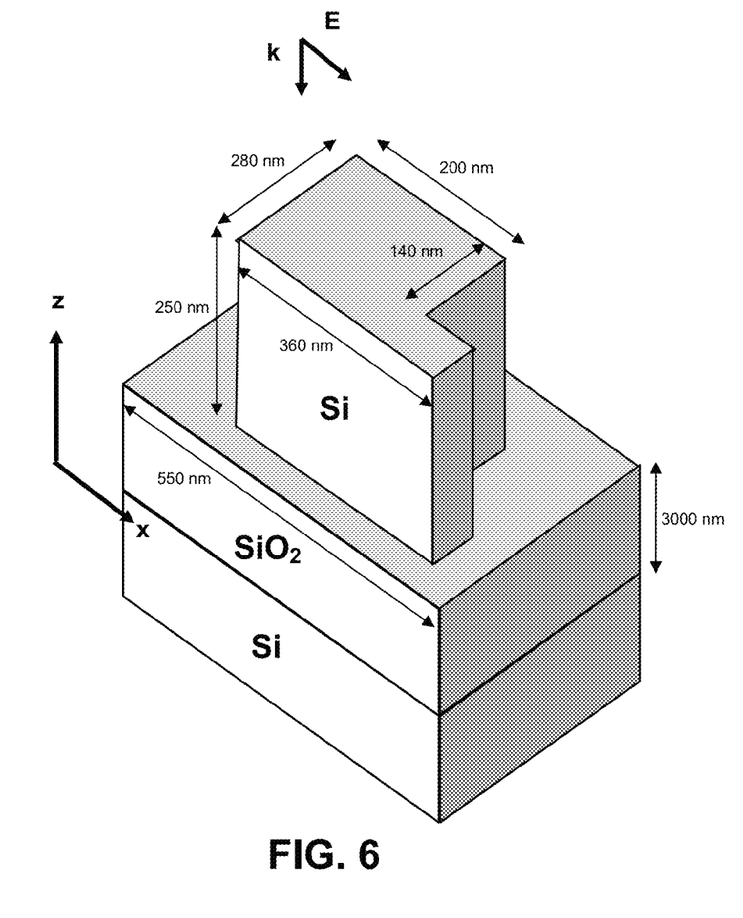
FIG. 6 is a perspective view schematic illustration of an exemplary silicon-on-insulator resonator array Fano metasurface. The period of the metasurface is 550 nm.
Figure 7:
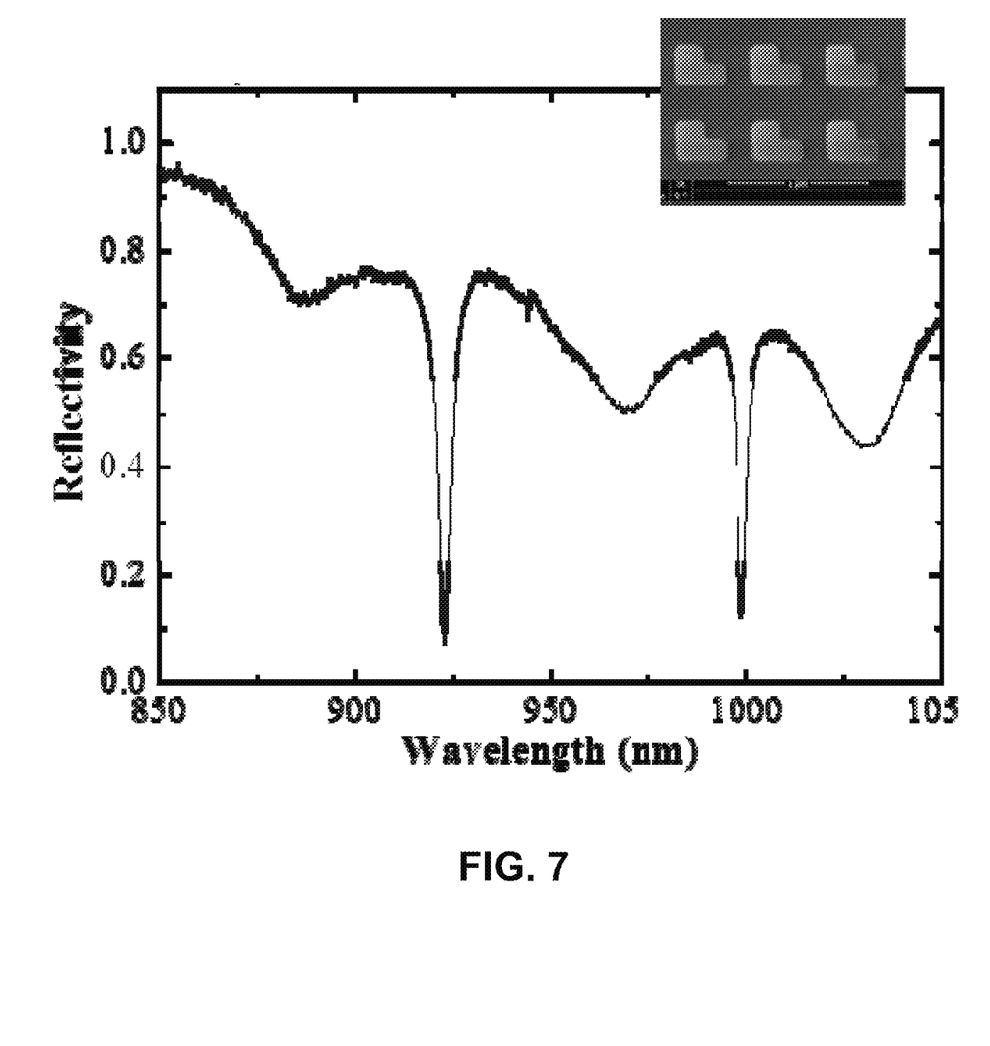
FIG. 7 is the experimentally measured reflectivity spectrum of the Si resonator array shown in the inset. The Q-factor for the resonance at 998.8 nm is ~350.

As an example of the invention, a silicon-based Fano metasurface operating near 1 μm wavelength was designed and fabricated, as shown in FIG. 6. The resonators were fabricated using silicon-on-insulator wafers with a 250 nm thick silicon layer. The nominal side length of the resonators was 280 nm and the array spacing was 550 nm. The arrays were fabricated using e-beam lithography and reactive ion etching. Reflectivity spectra were measured using a custom built near-infrared polarizing microscope coupled to a high-resolution spectrometer equipped with a CCD array detector. The inset of FIG. 7 shows a scanning electron micrograph (SEM) of several of the resonators in the array, along with the experimentally measured reflectivity spectrum. The measured spectrum shown in FIG. 7 is very similar to the simulated spectrum (not shown), although an overall wavelength shift is observed. This shift is attributed to slight dimensional differences between the designed and fabricated arrays. The measured quality-factor of the resonance at 998.8 nm is about 350. There is also a slight difference between the simulated and measured spectra in the shape of the shorter wavelength Fano resonance that is likely due to a small inaccuracy in the SOI buried oxide thickness used in the simulations. The buried oxide forms a low finesse etalon that interferes with the Fano behavior and modulates the overall shape of the resonance.

Figure 8:
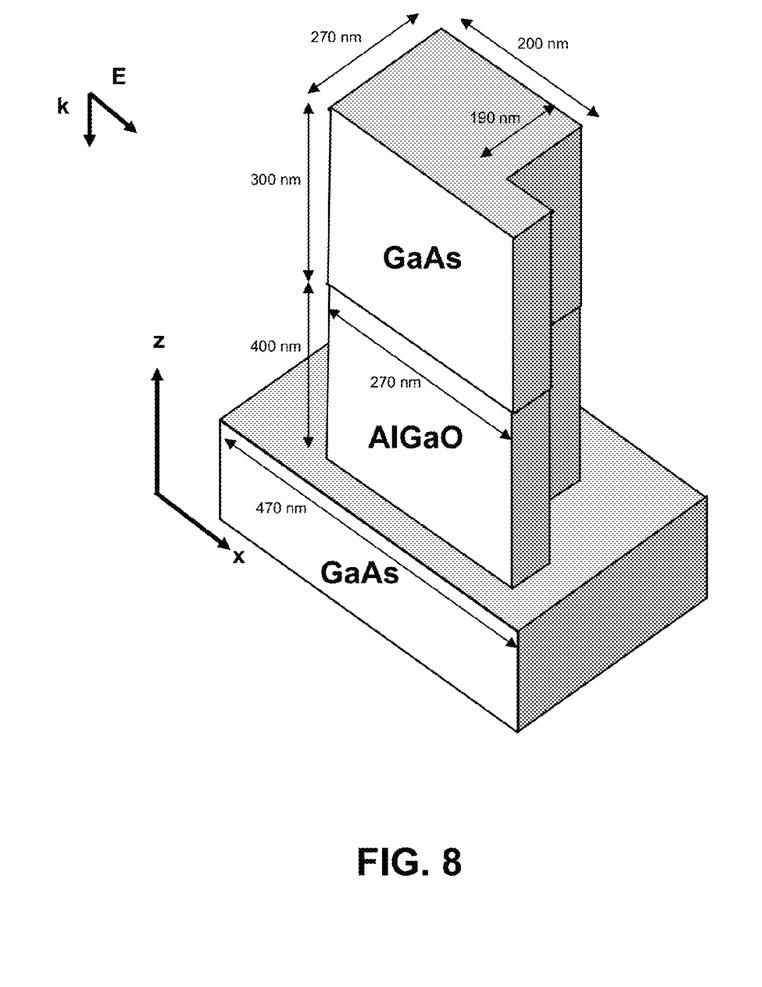
FIG. 8 is a perspective view schematic illustration of an exemplary GaAs-based Fano metasurface.

For another example of the broken symmetry Fano approach, a GaAs-based Fano metasurface was fabricated by adapting a processing scheme originally developed for surface emitting semiconductor lasers. See K. D. Choquette et al., *IEEE Journal of Selected Topics in Quantum Electronics* 3(3), 916 (1997); and K. D. Choquette et al., *Photonics Technology Letters* 7(11), 1237 (1995). In contrast to indirect bandgap Si used in the experimental demonstration described above, GaAs features a direct bandgap so that residual absorptive losses should be smaller in the near-infrared spectral range and larger Q-values might be possible. The resonator arrays were fabricated using epitaxially-grown GaAs layers and employ a novel means of isolating the resonators from the native GaAs substrate on which they were grown with a resonator-shaped AlGaO intermediate layer (alternatively, a continuous AlGaO intermediate layer could be used). Three GaAs Fano resonators with the same array pitch of 470 nm and height of 300 nm but different in-plane unit cell dimensional scaling factors of s=0.89, 0.92, and 0.95. FIG. 8 shows a schematic of the unit cell with a scaling factor of 1 that comprises a cuboid with nominal side length of 270 nm and a smaller cuboid notch with side dimensions of x=70 nm and y=190 nm cutting through the resonator.

Figure 9:
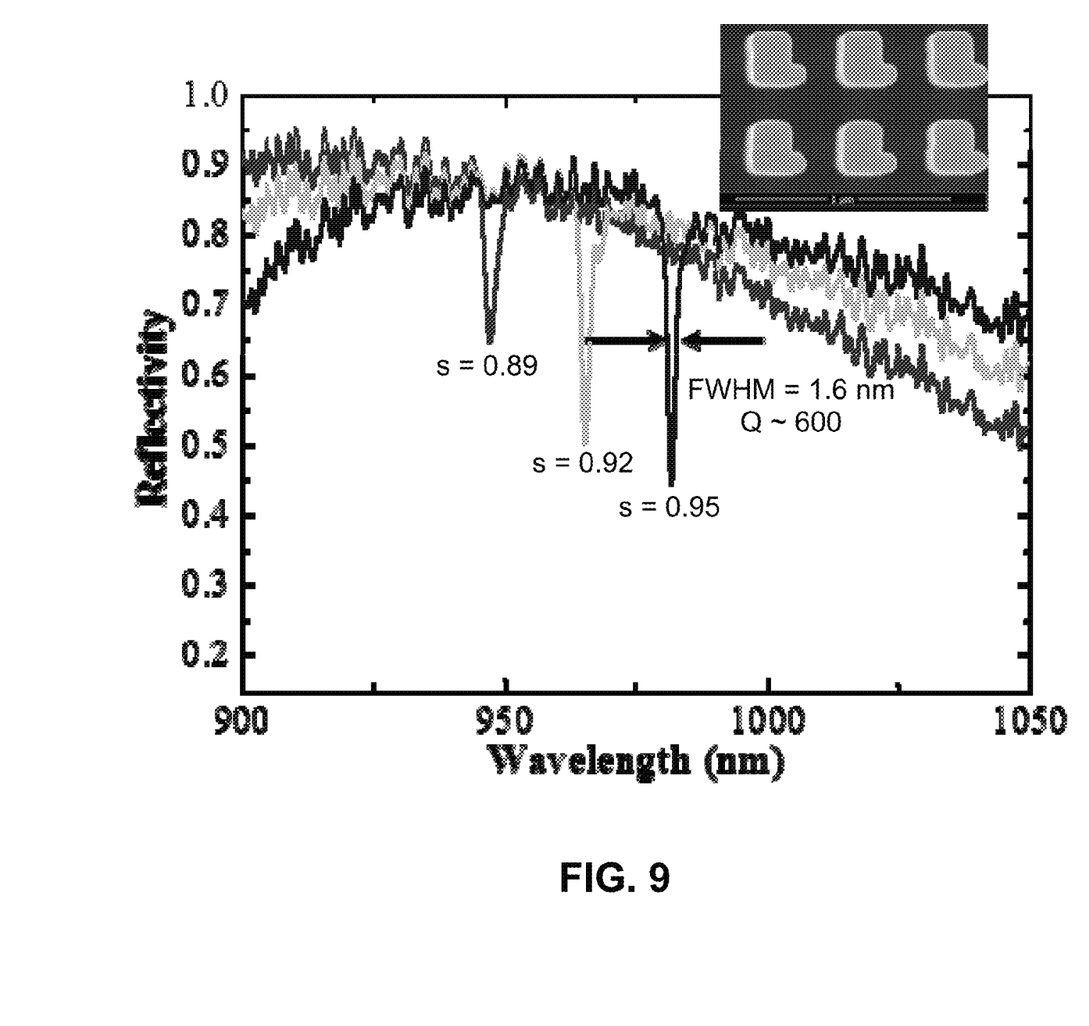
FIG. 9 is a graph of the measured reflectivity spectrum from three GaAs-based Fano metasurfaces with slightly different in-plane scalings (s) of a nominal 270×270×300 nm³ design. The array corresponding to the largest scaling factor exhibits a resonance with a FWHM of 1.6 nm, corresponding to a Q-factor of approximately 600. The inset shows an SEM of several of the resonators in the s=0.95 array.

FIG. 9 shows the experimental reflectivity spectrum for three GaAs Fano metasurfaces with slightly different in-plane dimensional scaling factors, s, of a nominal 270×270× 300 nm$^3$ (s=1.0) design. As expected, the Fano resonances shift to longer wavelength as the scaling factor increases. Notably, the FWHM of the Fano resonance is 1.6 nm for the metasurface corresponding to the largest scaling factor. This corresponds to a Q-factor of ~600. Low temperature reflectivity measurements (not shown here) showed a shifting of the spectral location of the Fano resonance, but did not reveal any further narrowing of the resonance. The achievement of such high-Q resonances along with their large field enhancements in GaAs is particularly exciting since it opens up new avenues for device designs that exploit the active and nonlinear properties of GaAs.

The present invention has been described as a high quality-factor Fano metasurface comprising a single resonator unit cell. It will be understood that the above description is merely illustrative of the applications of the principles of the present invention, the scope of which is to be determined by the claims viewed in light of the specification. Other variants and modifications of the invention will be apparent to those of skill in the art.

We claim:
1. Fano metasurface, comprising:
dielectric substrate comprising an intermediate layer on the substrate;
a periodic two-dimensional array of single-resonator unit cells on the intermediate layer, each resonator comprising at least one perturbation in a symmetric dielectric structure wherein the at least one perturbation has a different permittivity than that of the dielectric structure material and wherein the intermediate layer has a lower permittivity than the permittivity of the dielectric structure material,
wherein the resonator has an electric or magnetic dipole moment in the plane of the substrate that couples to normally incident light and at least one out-of-plane electric or magnetic dipole moment that couples in the near-field to the in-plane electric or magnetic dipole moment, whereby the out-of-plane electric or magnetic dipole moment provides a narrow spectral resonance within a broad spectral resonance provided by the in-plane electric or magnetic dipole moment.

2. The Fano metasurface of claim 1, wherein the dielectric structure comprises Si and the intermediate layer comprises $SiO_2$.

3. The Fano metasurface of claim 1, wherein the dielectric structure comprises GaAs and the intermediate layer comprises AlGaO.

4. Fano metasurface, comprising:
a periodic two-dimensional array of single-resonator unit cells on a dielectric substrate, each resonator comprising at least one perturbation in a symmetric dielectric structure wherein the at least one perturbation has a different permittivity than that of the dielectric structure and wherein the symmetric dielectric structure comprises a sphere, a prism, a pyramid, a cube, or a cylinder,
wherein the resonator has an electric or magnetic dipole moment in the plane of the substrate that couples to normally incident light and at least one out-of-plane electric or magnetic dipole moment that couples in the near-field to the in-plane electric or magnetic dipole moment, whereby the out-of-plane electric or magnetic dipole moment provides a narrow spectral resonance within a broad spectral resonance provided by the in-plane electric or magnetic dipole moment.

5. The Fano metasurface of claim 4, wherein the symmetric dielectric structure comprises a cube and wherein the perturbation comprises a notch.

6. The Fano metasurface of claim 4, wherein the symmetric dielectric structure comprises a cube and wherein the perturbation comprises a tilted or stepped sidewall.

7. Fano metasurface, comprising:
a periodic two-dimensional array of single-resonator unit cells on a dielectric substrate, each resonator comprising at least one perturbation in a symmetric dielectric structure wherein the at least one perturbation is filled with a material having a different permittivity than the dielectric structure material,
wherein the resonator has an electric or magnetic dipole moment in the plane of the substrate that couples to normally incident light and at least one out-of-plane electric or magnetic dipole moment that couples in the near-field to the in-plane electric or magnetic dipole moment, whereby the out-of-plane electric or magnetic dipole moment provides a narrow spectral resonance within a broad spectral resonance provided by the in-plane electric or magnetic dipole moment.

8. The Fano metasurface of claim 1, 4, or 7, wherein the dielectric structure comprises germanium, tellurium, silicon, or a IV-VI compound comprising lead.

9. The Fano metasurface of claim 1, 4, or 7, wherein the dielectric structure comprises a III-V compound.

10. The Fano metasurface of claim 9, wherein the III-V compound comprises gallium arsenide or gallium nitride.

11. The Fano metasurface of claim 4 or 7, wherein the dielectric substrate comprises a material having a lower permittivity than the permittivity of the dielectric structure material.

12. The Fano metasurface of claim 11, wherein the dielectric structure comprises Ge and dielectric substrate comprises $BaF_2$.

13. The Fano metasurface of claim 1, 4, or 7, wherein the incident light has a wavelength between 0.75 μm and 1 m.

14. The Fano metasurface of claim 1, 4, or 7, wherein the narrow spectral resonance has a Q-factor of greater than 100.

15. The Fano metasurface of claim 1, 4, or 7, wherein the size of the unit cell is smaller than the wavelength of the incident light.

16. The Fano metasurface of claim 1, 4, or 7, wherein the size of the periodic two-dimensional array is greater than a 5×5 array.

* * * * *